United States Patent
Yeung et al.

(10) Patent No.: US 8,321,772 B1
(45) Date of Patent: Nov. 27, 2012

(54) SOVA SHARING DURING LDPC GLOBAL ITERATION

(75) Inventors: Kwok W. Yeung, Milpitas, CA (US); Kin Man Ng, Cupertino, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 546 days.

(21) Appl. No.: 12/587,999

(22) Filed: Oct. 14, 2009

Related U.S. Application Data

(60) Provisional application No. 61/196,633, filed on Oct. 20, 2008.

(51) Int. Cl.
  *G06F 11/00* (2006.01)
(52) U.S. Cl. .................................................. 714/795
(58) Field of Classification Search .................. 714/795
  See application file for complete search history.

(56) References Cited

U.S. PATENT DOCUMENTS

| | | | |
|---|---|---|---|
| 5,764,646 A | 6/1998 | Dent | |
| 6,757,337 B2 | 6/2004 | Zhuang et al. | |
| 7,032,156 B2 | 4/2006 | Yu et al. | |
| 7,127,664 B2 | 10/2006 | Nicol et al. | |
| 7,978,793 B2 * | 7/2011 | Anekoji | 375/341 |
| 2002/0129318 A1 * | 9/2002 | Campello De Souza et al. | 714/795 |
| 2008/0276156 A1 | 11/2008 | Gunnam et al. | |
| 2008/0301521 A1 | 12/2008 | Gunnam et al. | |
| 2009/0177945 A1 * | 7/2009 | Djordjevic et al. | 714/758 |
| 2009/0193313 A1 * | 7/2009 | Kong et al. | 714/755 |
| 2010/0042906 A1 * | 2/2010 | Gunnam et al. | 714/780 |
| 2011/0060969 A1 | 3/2011 | Ramamoorthy et al. | |

* cited by examiner

*Primary Examiner* — Bryce Bonzo
(74) *Attorney, Agent, or Firm* — Van Pelt, Yi & James LLP

(57) ABSTRACT

A technique for decoding information, including a Viterbi decoder configured to decode (1) Front-end processed ADC data and (2) an output of an iterative error correction decoder in the event error correction decoding fails. The iterative error correction decoder is configured to decode Viterbi decoded data generated by the Viterbi decoder.

22 Claims, 13 Drawing Sheets

SOVA SHARING DURING LDPC GLOBAL ITERATION

CROSS REFERENCE TO OTHER APPLICATIONS

This application claims priority to U.S. Provisional Patent Application No. 61/196,633 entitled SOVA SHARING DURING LDPC GLOBAL ITERATION filed Oct. 20, 2008 which is incorporated herein by reference for all purposes.

BACKGROUND OF THE INVENTION

In some error correction systems, encoded data is first decoded by a Viterbi decoder and then by a low-density parity-check (LDPC) decoder. In some cases, the encoded data fails LDPC decoding (e.g., because there is a significant amount of noise in the encoded data being processed). In such cases, Viterbi decoding is performed once more for a global iteration (turbo equalization). It would be desirable to develop systems that perform this operation.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
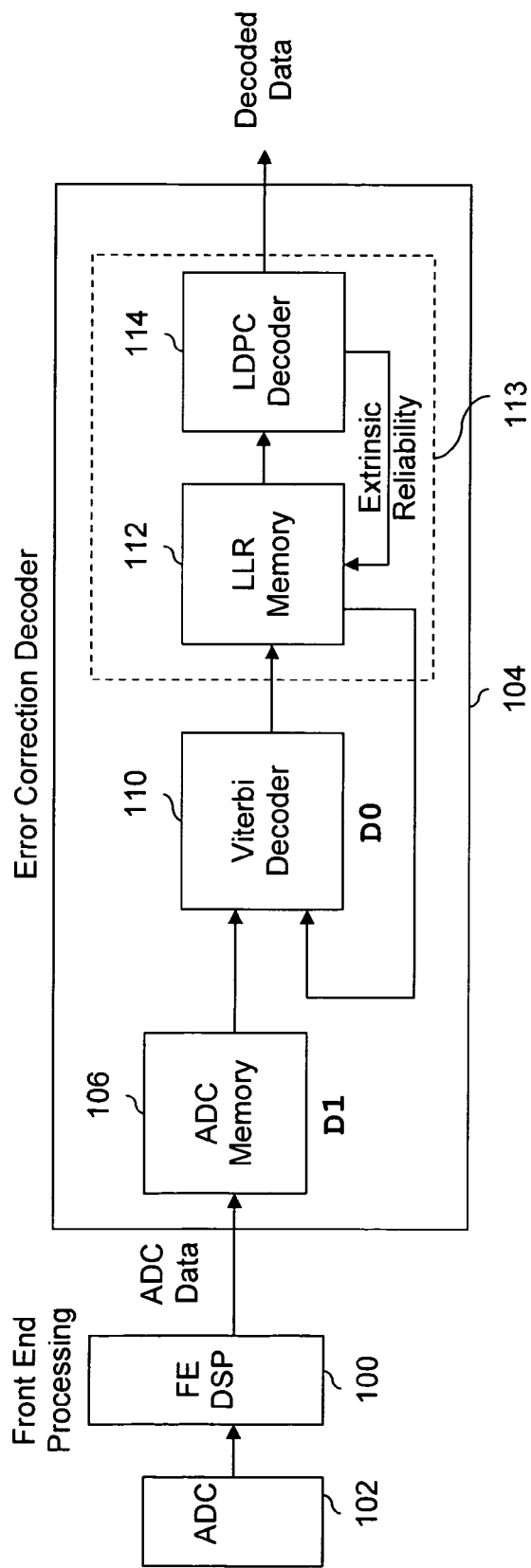
FIG. 1 is a diagram showing an embodiment of an error correction system.

FIG. 1 is a diagram showing an embodiment of an error correction system. In the example shown, the decoding system shown in FIG. 1 is part of a storage system such as a disk storage system. Stored information is retrieved from disk media by analog-to-digital converter 102, followed by a Front-end DSP 100 which outputs ADC data.

The ADC data output by Front-end DSP 100 is passed to error correction decoder 104 which includes ADC memory 106. ADC memory 106 is configured to buffer ADC data from Front-end DSP 100 in the event Viterbi decoder 110 is occupied. In some embodiments, Viterbi decoder 100 is a soft output Viterbi decoder. In this example, ADC memory 106 operates in a first-in, first-out (FIFO) manner. If Viterbi decoder 110 is not occupied and no higher-priority data needs to be decoded, ADC data passes directly through ADC memory 106 to Viterbi decoder 110.

Viterbi decoder 110 is configured to process ADC data (via ADC memory 104) or the output of LDPC decoder 114 in the event the LDPC decoder fails. Viterbi decoder 110 may be configured to operate in FIFO manner. For example, if the output of LDPC decoder 114 is completely available earlier than ADC data from ADC memory 106, the output of LDPC decoder 114 will be processed by Viterbi decoder 110. In some embodiments, Viterbi decoder 110 may be configured to give higher priority to process the output of LDPC decoder 114 in the event the LDPC decoder fails and that a retry is needed. The decision of using FIFO or giving higher priority to retry may be related to system requirement. The retry with higher priority scheme will be used as an example in this document.

The output of Viterbi decoder 110 is passed to block 113 which includes log-likelihood ratio (LLR) memory 112. Although this example shows LLR memory 112 followed by LDPC decoder 114 in block 113, LLR memory 112 in not necessary and in some embodiments is not included. Similarly, although some other examples described herein may include a memory before an LDPC decoder, it is not necessary to include such a memory. In some embodiments, LLR memory 112 is included to improve a processing time. If LDPC decoder 114 is not busy and there is no higher priority information buffered in LLR memory 112, the output of Viterbi decoder 110 may pass directly through LLR memory and be processed by LDPC decoder 114. LLR memory 112 is used to buffer outputs from Viterbi decoder 110 in the event LDPC decoder 114 is occupied. LLR memory 112 is also configured to store extrinsic reliability information from LDPC decoder 114 in the event the LDPC decoder fails and a sector (or other "chunk" of information being processed) is retried. LLR memory 112 is configured to operate as a FIFO on the output data of Viterbi decoder 110 which are to be processed by LDPC decoder 114, regardless the data being processed for the first time or not.

More generally, block 113 is an iterative ECC (i.e., an error correcting (de)coder that operates iteratively). In this particular example, block 113 is shown as an LLR memory and an LDPC decoder. In some other embodiments, an iterative ECC includes an LDCP decoder and no memory.

LDPC decoder 114 can have two outcomes after processing concludes: decoding succeeds or fails. If decoding is successful, the output of LDPC decoder 114 is output from error correction decoder 104 as decoded data. If decoding fails, the system may decide to retry decoding. In some embodiments, a retry is performed if the number of failures for that sector (or some other "chunk" of information being processed) does not exceed a maximum number of failures. If a retry occurs, extrinsic reliability information is passed from LDPC decoder 114 to LLR memory 112 for storage. In this example, to ensure that there is available space in LLR memory 112 for extrinsic reliability in the event of a retry, LLR memory 112 is configured to reserve space while LDPC processing is being performed for a given sector. In such embodiments, if LDPC decoding is successful, LLR memory 112 is informed it can release the reservation and can use the reserved space to store other information. If the decoding is unsuccessful, the extrinsic reliability is stored in the reserved space.

If a retry is attempted, the output of LDPC decoder 114 is passed back to Viterbi decoder 110 for global iteration (turbo equalization). In this example, the output of LDPC decoder 114 is passed to LLR memory 112 first, and eventually is passed back to Viterbi decoder 110. Viterbi decoder 110 operates in FIFO to choose data between ADC data from ADC memory and the output of LDPC decoder 114 as retry. Once Viterbi decoder 110 has completing processing of the retry, the output is passed to LLR memory and is passed to LDPC decoder 114 for another decoding attempt.

While Viterbi decoder 110 is processing a retry, LDPC decoder 114 in this example is free and processes any Viterbi decoded data stored in LLR memory 112. LLR memory 112 operates in a FIFO manner and outputs the sector waiting the longest time to be processed by LDPC decoder 114.

Figure 2:
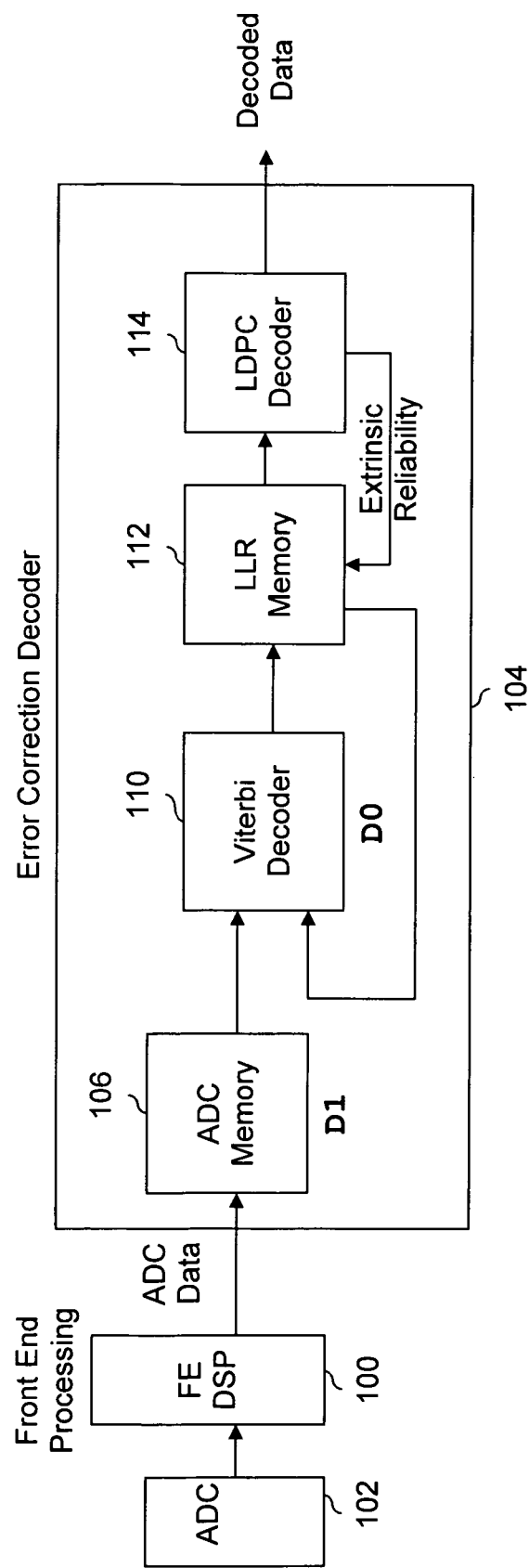
FIG. 2 is a diagram showing an embodiment of an error correction system shown at a first point in time.

FIG. 2 is a diagram showing an embodiment of an error correction system shown at a first point in time. In the example shown, the error correction system of FIG. 1 is shown with example data passing through the system. In this and other figures described below, ADC data output by Front-end DSP 100 is output in the order D0, D1, D2, . . . . That is, D0 is the first piece of data (e.g., a sector) output, D1 is the second piece of data output, etc.

At the point in time shown here, D0 is being processed by Viterbi decoder 110. Since Viterbi decoder 110 is busy processing D0, D1 is stored in ADC memory 106 until Viterbi decoder 110 is free.

Figure 3:
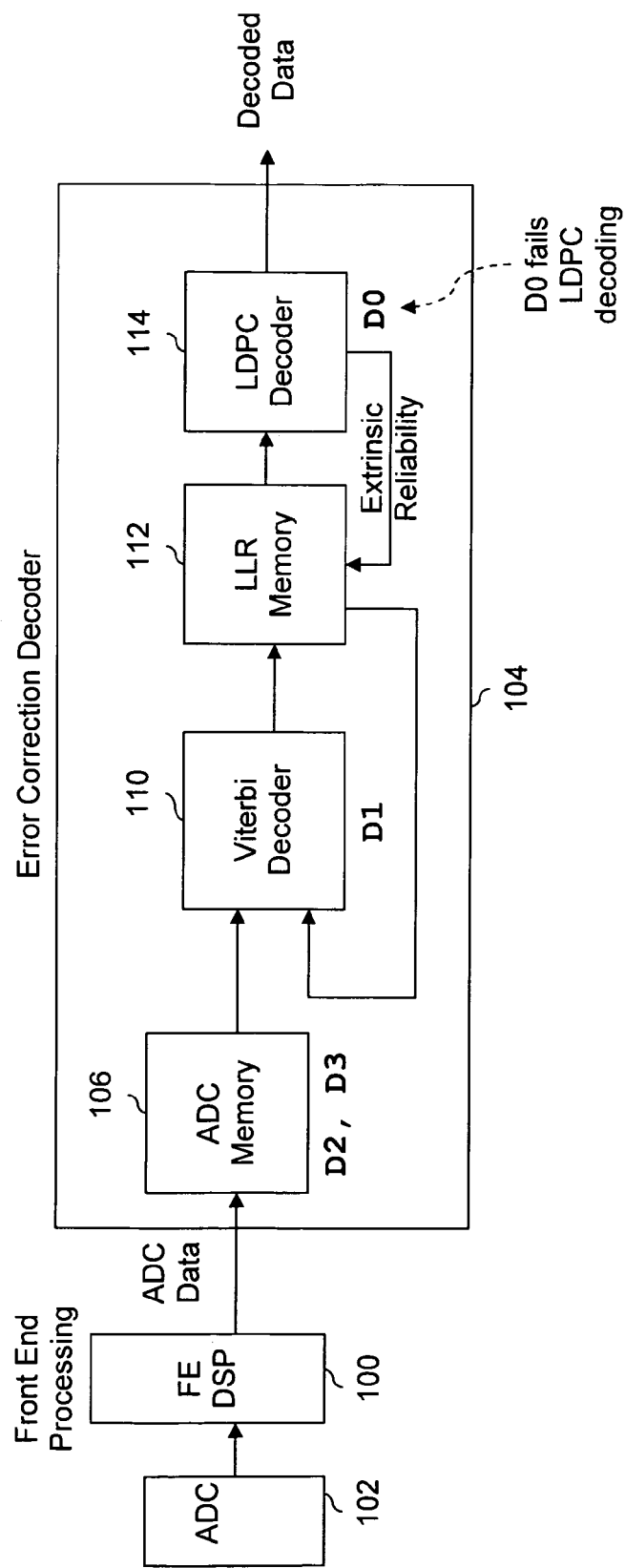
FIG. 3 is a diagram showing an embodiment of an error correction system shown at a second point in time.

FIG. 3 is a diagram showing an embodiment of an error correction system shown at a second point in time. In the example shown, Viterbi decoder 110 is processing D1 and ADC memory 106 is storing D2 and D3. D0 is being processed by LDPC decoder 114 but will fail LDPC decoding.

Figure 4:
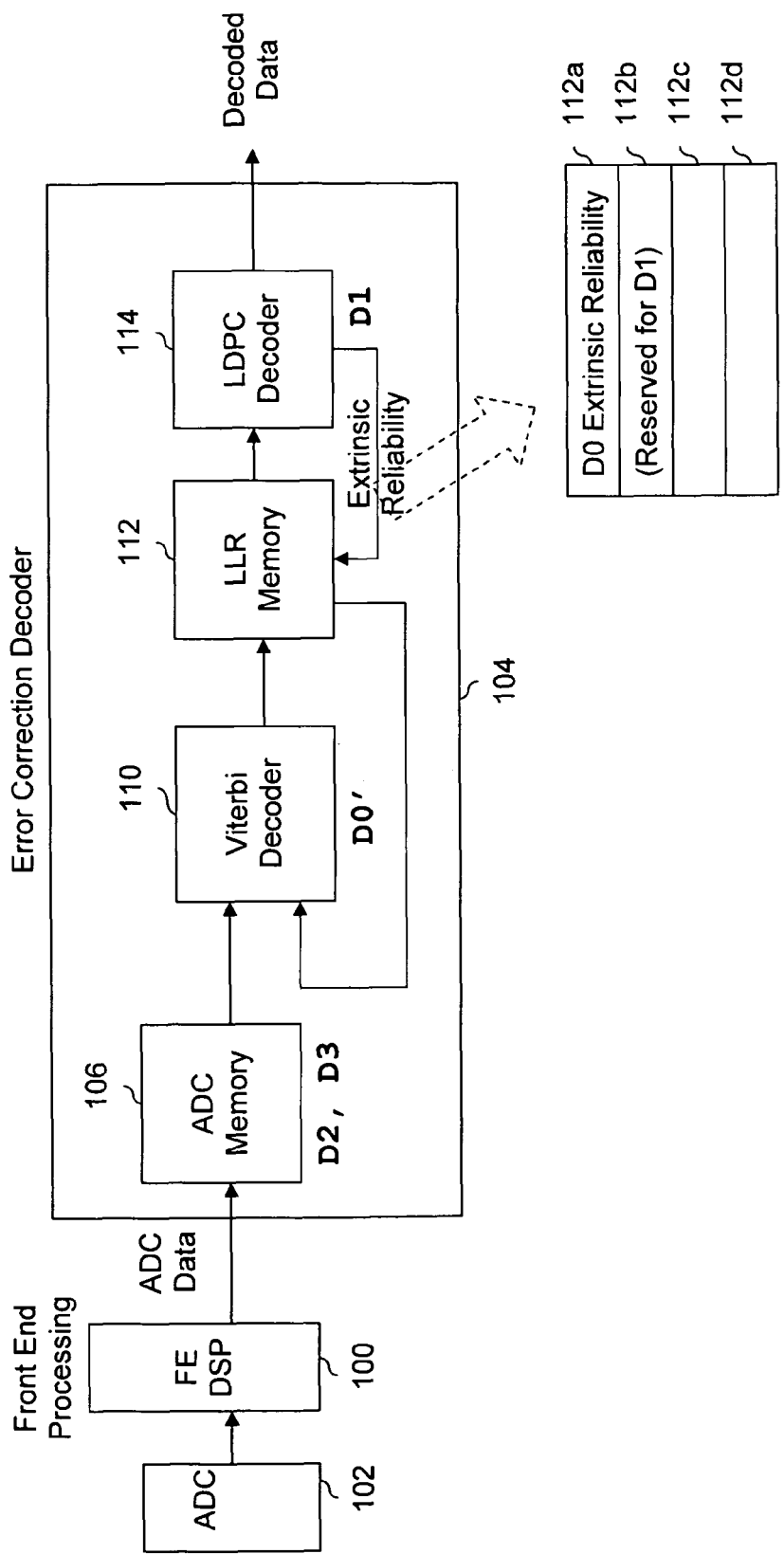
FIG. 4 is a diagram showing an embodiment of an error correction system shown at a third point in time.

FIG. 4 is a diagram showing an embodiment of an error correction system shown at a third point in time. After failing LDPC decoding, extrinsic reliability information for D0 is stored in LLR memory 112 at slot 112a. In the example shown, LLR memory 112 includes four slots. In some other embodiments, the number of slots varies (e.g., based on the processing time of LDPC decoder 114, the processing time of Viterbi decoder 110, the arrival rate of ADC data, and/or the number of retries permitted). In some embodiments, the size of LLR memory 112 and/or ADC memory 106 is determined via simulation. For example, a simulation may be set up where ADC data arrives at a certain arrival rate, the ADC data contains an expected or maximum amount of noise, there are a maximum number of retries for a given sector, and LDPC decoder and Viterbi decoder take a certain amount of processing time.

In the example, assuming Viterbi decoder 110 is configured to give higher priority to the output of LDPC decoder 114 in case a retry is decided. Although D2 and D3 were stored in ADC memory 106 waiting to be processed by Viterbi decoder 110 (see FIG. 3), the retry of D0 has higher priority and D2 and D3 are remain in ADC memory 106 and Viterbi decoder 110 processes the retry of D0. In this example, the retry of D0 is indicated as D0'. If Viterbi decoder 110 is configured to operate in FIFO manner, the Viterbi decoder 110 will process the sector in this order: D2, D3 and the retry of D0.

In the example shown, a slot is reserved for the data being processed by LDPC decoder 114 in the event decoding for that piece of data fails. In this example, slot 112b is reserved for D1 which is currently being processed by LDPC decoder 114.

In this example, Viterbi decoder 110 is configured to give a high priority to the LDPC data being retried as opposed to data from ADC memory 106. In some embodiments, Viterbi decoder 110 is configured to operate in a First In, First Out (FIFO) manner where data is operated on in the order in which it arrived. In some embodiments, a system is configurable so that a Viterbi decoder operates in a FIFO manner or alternatively prioritizes data (e.g., as specified by a user).

Figure 5:
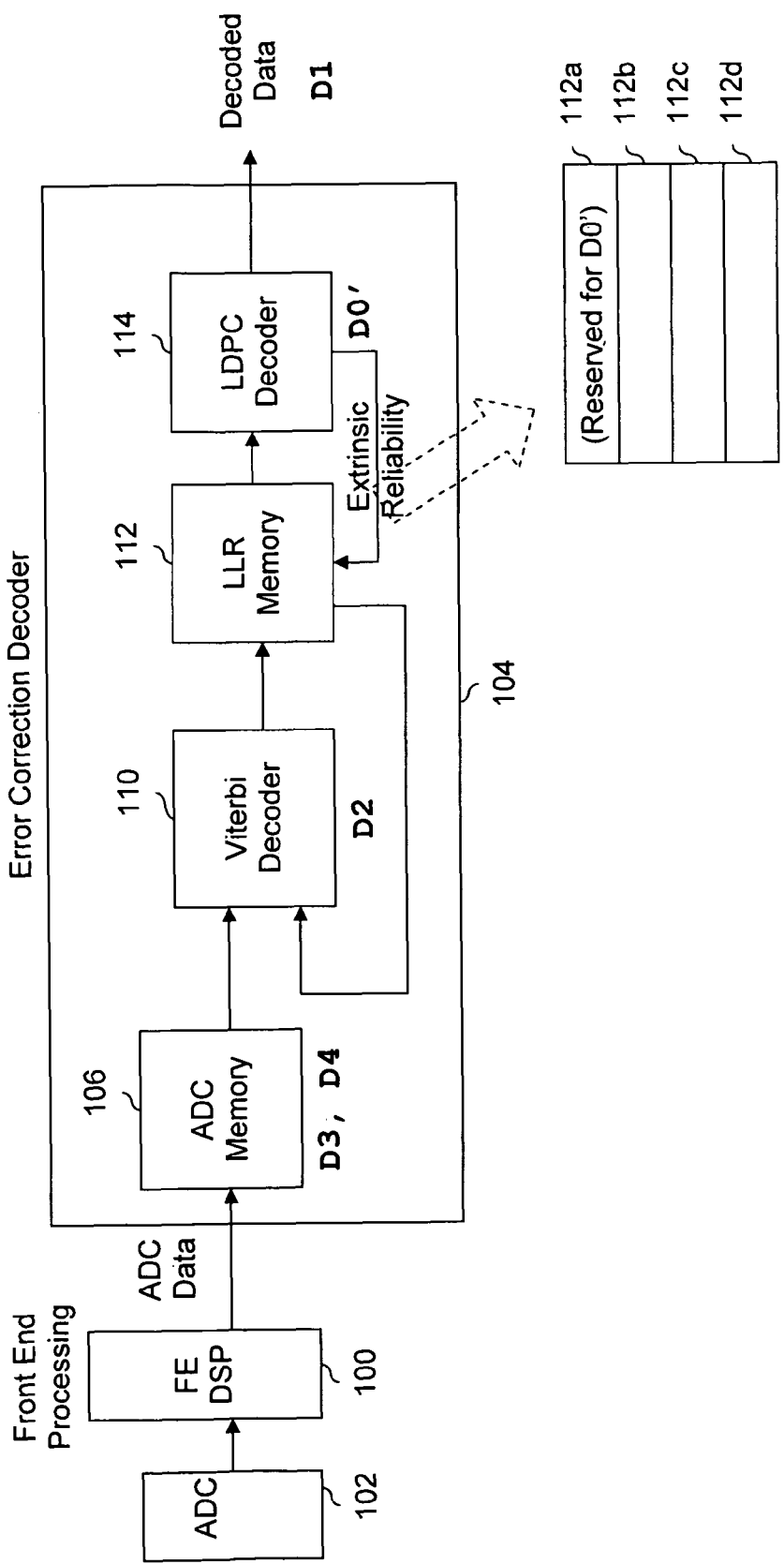
FIG. 5 is a diagram showing an embodiment of an error correction system shown at a fourth point in time.

FIG. 5 is a diagram showing an embodiment of an error correction system shown at a fourth point in time. In the example shown, D1 has successfully completed LDPC decoding and is output as decoded data by error correction decoder 104. The reservation of slot 112b for D1 (see FIG. 4) is released since LDPC decoding completed successfully for that piece of data.

The retry of D0 (i.e., D0') has completed Viterbi decoding and the output of Viterbi decoder 110 for D0 stored in LLR memory 112 (see slot 112a in FIG. 4) are passed to LDPC decoder 114 for processing. Slot 112a is reserved for (the retry of) D0 in case LDPC processing fails again. In some embodiments, if D0 fails LDPC decoding for a certain number of times, the system declares an error for that sector.

D2 is the oldest piece of data that was stored in ADC memory 106 and is processed by Viterbi decoder 110. Since no retry was pending, Viterbi decoder 110 processed the next piece of ADC data stored in ADC memory 106 in a FIFO manner.

Figure 6:
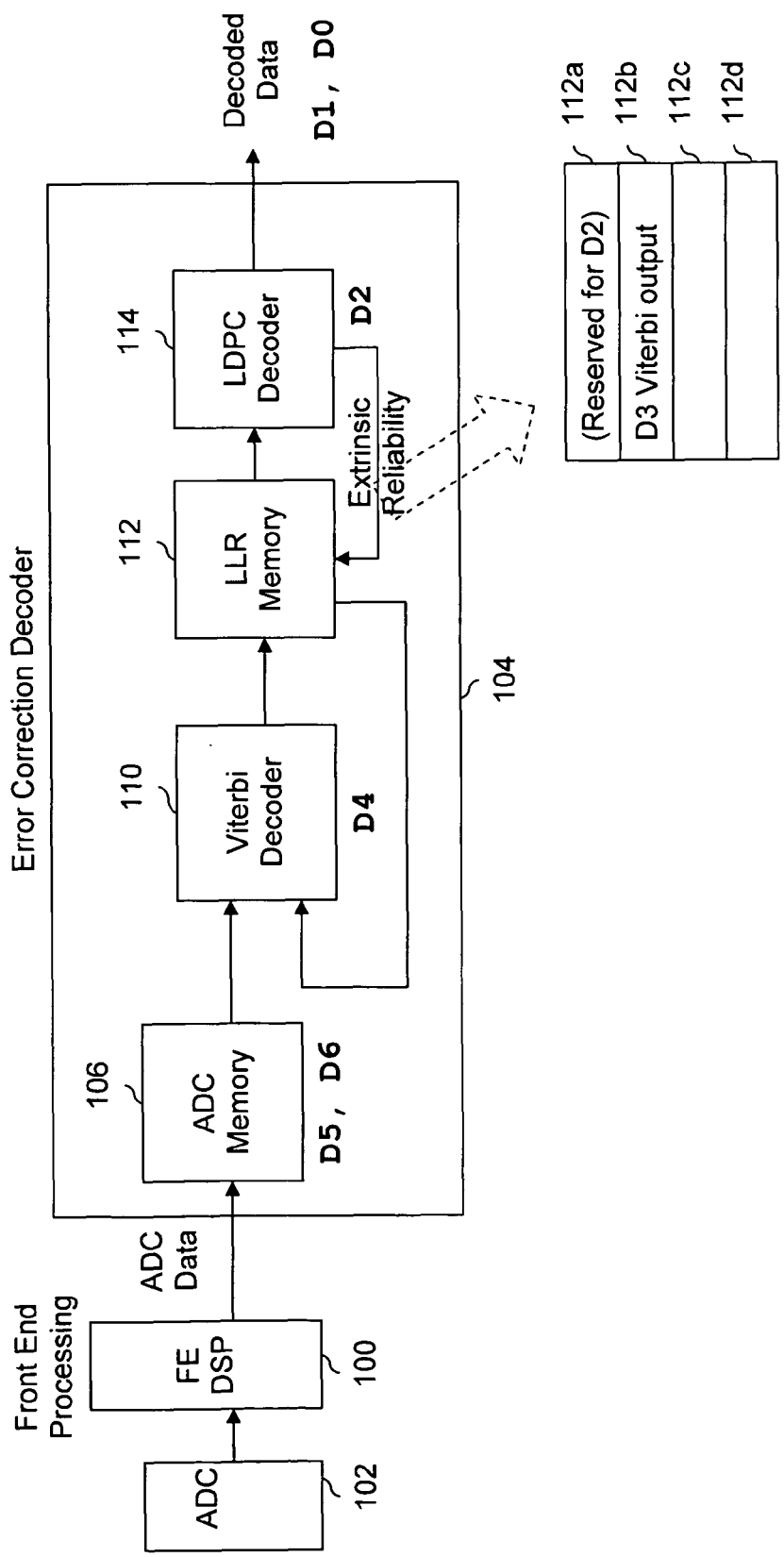
FIG. 6 is a diagram showing an embodiment of an error correction system shown at a fifth point in time.

FIG. 6 is a diagram showing an embodiment of an error correction system shown at a fifth point in time. In the example shown, the retry of D0 successfully completed LDPC decoding and is output as decoded data. As shown in this example, decoded data can (in some cases) be output out of order (e.g., D1 was output as decoded data before D0).

LDPC decoder 114 is processing D2 and slot 112a in LLR memory 112 is reserved for D2. Since LDPC decoder 114 is occupied processing D2 but Viterbi processing for D3 has completed, the Viterbi output for D3 is stored in slot 112b in LLR memory 112. Viterbi decoder 110 is processing D4 and ADC memory 106 is storing D5 and D6 until they can be processed by Viterbi decoder 110.

Figure 7:
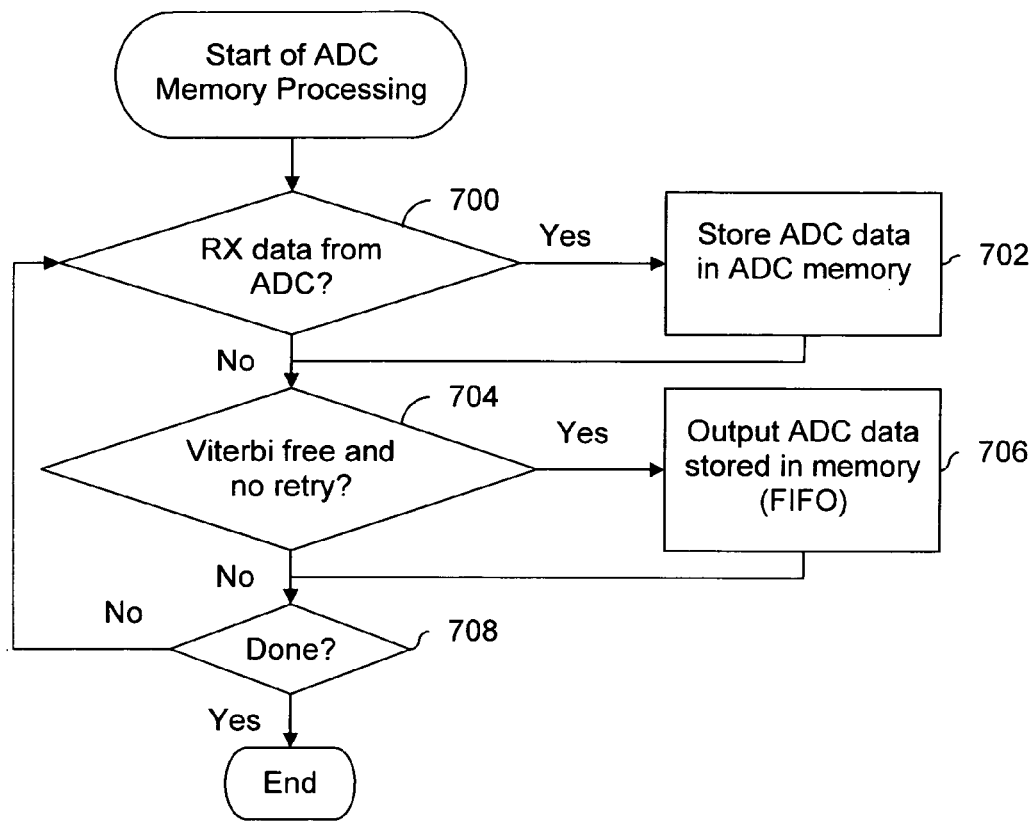
FIG. 7 is a flowchart illustrating an embodiment of ADC memory processing.

FIG. 7 is a flowchart illustrating an embodiment of ADC memory processing. In the example shown, the processing is performed by ADC memory 106 in FIG. 1. At 700, it is determined if data is received from an ADC. For example, in some embodiments Front-end DSP 100 and error correction decoder 104 are implemented on different application-specific integrated circuits (ASICs) or field-programmable gate arrays (FPGAs) and an ADC memory may not necessarily know or control when data is received.

If data is received, the ADC data is stored in ADC memory at 702. After storing data at 702 or if no data is received, it is determined at 704 if a Viterbi decoder is free and there is no retry. For example, in FIG. 4, the retry of D0 has priority over D2 and D3 at Viterbi decoder 110. If the Viterbi is free and there is no retry, ADC data stored in memory is output at 706. In this example, data is output by the ADC memory in a FIFO manner. After outputting data at 706 or the Viterbi is not free and/or there is a retry, it is determined at 708 if the process is done. If not, the process determines at 700 is data is received.

Figure 8:
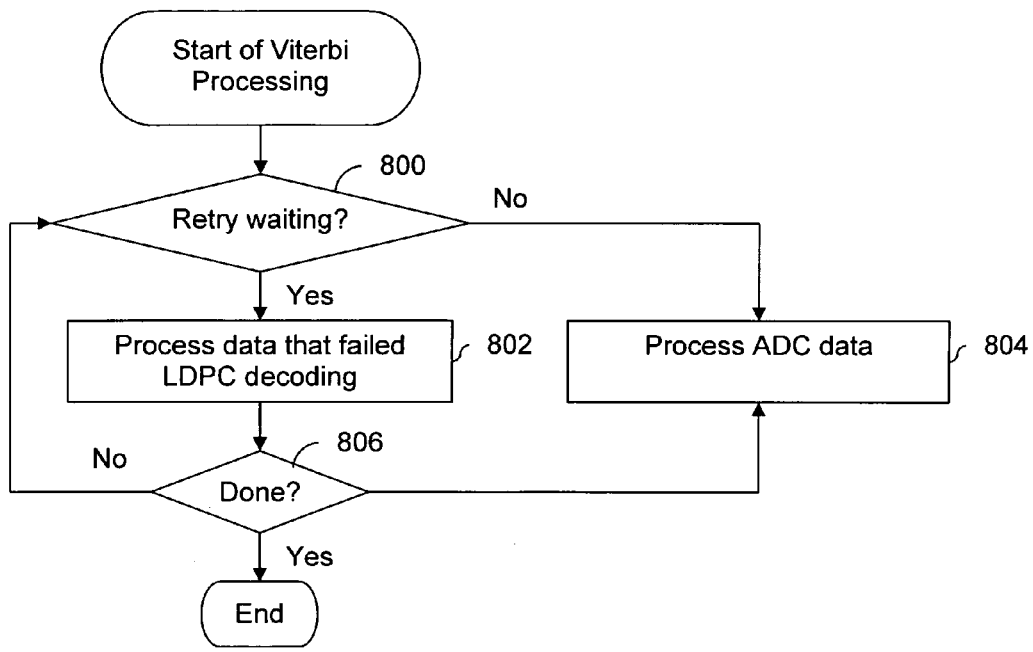
FIG. 8 is a flowchart illustrating an embodiment of Viterbi decoder processing.

FIG. 8 is a flowchart illustrating an embodiment of Viterbi decoder processing. In the example shown, the processing is performed by Viterbi decoder 110 in FIG. 1. At 800, it is determined if a retry is waiting. For example, in FIG. 4 data D0 needs to be retried, whereas in FIG. 5 there is no retry waiting and data D2 is processed. If there is a retry, data that failed LDPC decoding is processed at 802. Otherwise, ADC data is processed at 804. Referring back to the example of FIG. 1, the select signal (not shown) of multiplexer 108 controls whether processing at step 802 or 804 is performed.

After processing at 802 or 804, it is determined at 806 whether the process is done. If not, it is determined at 800 if a retry is waiting.

Figure 9:
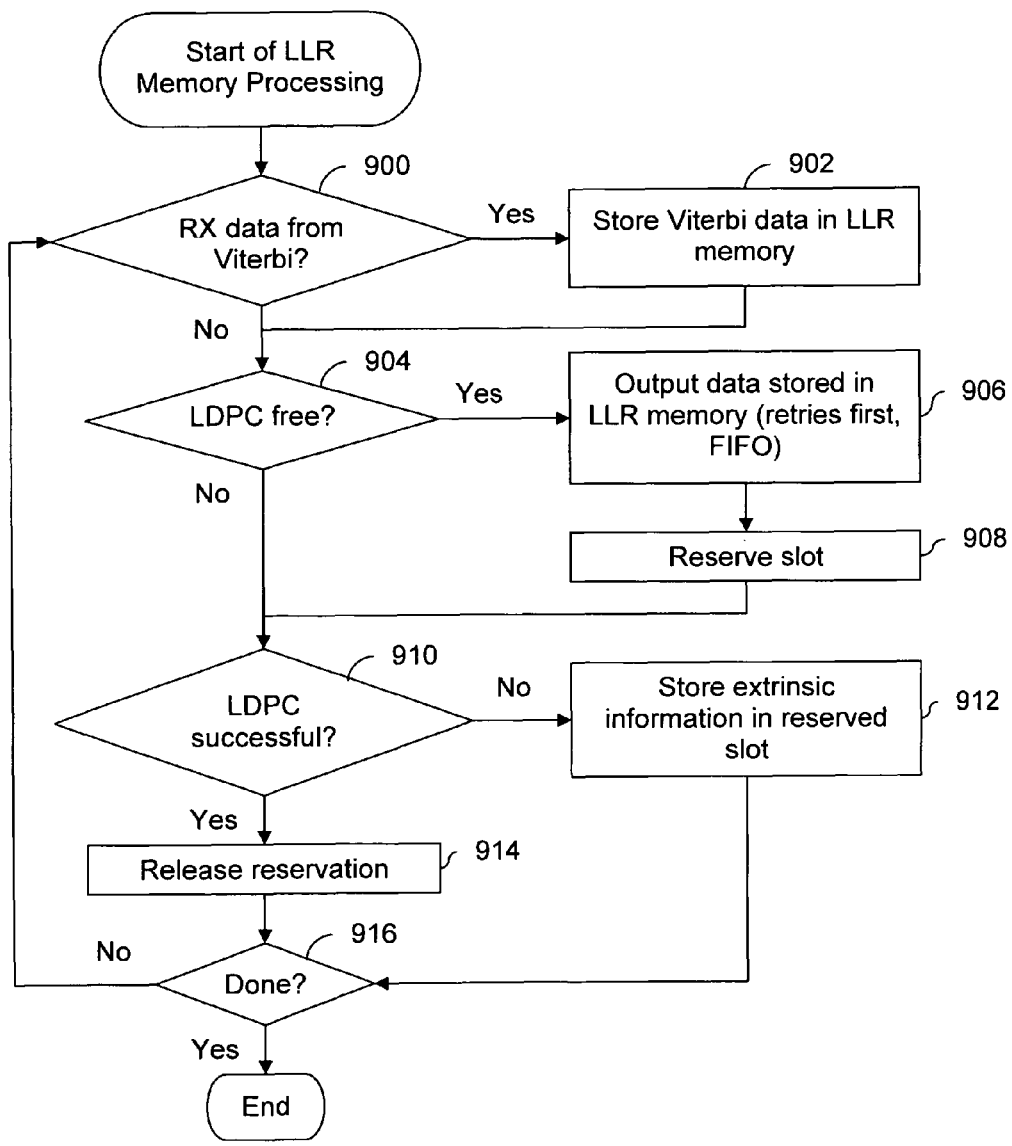
FIG. 9 is a flowchart illustrating an embodiment of LLR memory processing.

FIG. 9 is a flowchart illustrating an embodiment of LLR memory processing. In the example shown, the processing is performed by LLR memory 112 in FIG. 1. At 900, it is determined if data is received from a Viterbi decoder. If so, the Viterbi data is stored in the LLR memory at 902. For example, in FIG. 6, slot 112*b* is used to store the Viterbi output for D3. After storing at 902 or if there is no data received, it is determined if the LDPC decoder is free at 904. If so, data stored in the LLR memory is output at 906. Retries are output first, then non-retries in a FIFO manner. A slot is reserved at 908. For example, in FIG. 6, while D2 is being processed by LDPC decoder 114, slot 112*b* is reserved for D2 in the event D2 fails LDPC decoding and space is required for extrinsic reliability associated with D2 to be stored.

If the LDPC is busy at 904 or after reserving a slot at 908, it is determined if the LDPC was successful at 910. If so, the reservation is released at 914, otherwise the extrinsic reliability is stored in the reserved slot at 912. After releasing the slot at 914 or after storing extrinsic reliability at 912, it is determined if the process is done. If not, it is determined if data has been received from the Viterbi decoder at 900.

Figure 10:
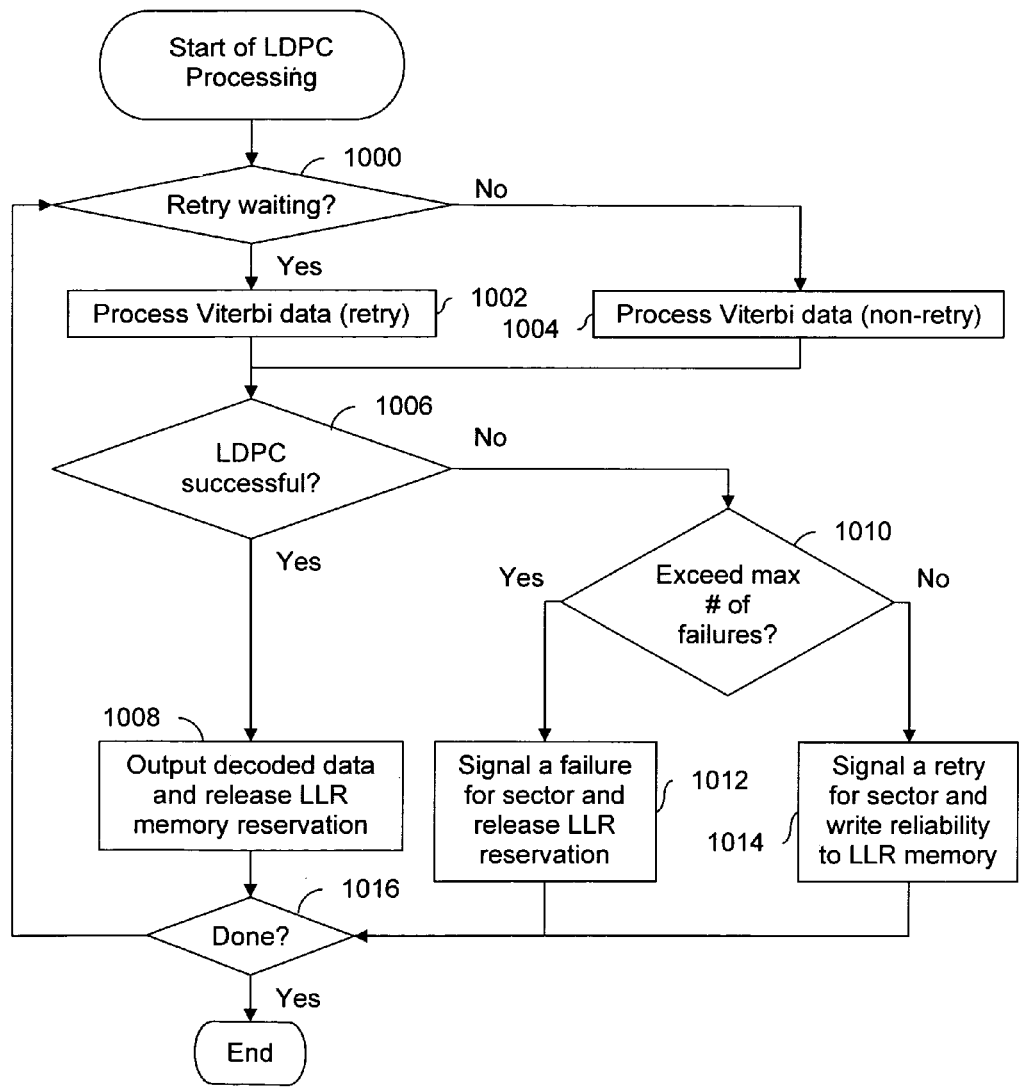
FIG. 10 is a flowchart illustrating an embodiment of LDPC decoder processing.

FIG. 10 is a flowchart illustrating an embodiment of LDPC decoder processing. In the example shown, the processing is performed by LDPC decoder 114 in FIG. 1. At 1000, it is determined if a retry is waiting. If so, Viterbi data for a retry is processed at 1002, otherwise Viterbi data for a non-retry is processed at 1004. After processing at 1002 or 1004, it is determined at 1006 if the LDPC was successful. If so, decoded data is output and the LLR memory reservation is released at 1008. See, e.g., FIGS. 4 and 5 where D1 is output as decoded data and the reservation of slot 112*b* is released. If LDPC decoding fails, it is determined if a maximum number of failures has been exceeded at 1010. If so, a failure is signaled for a sector and a LLR reservation is released at 1012. If not, a retry for sector is signaled and the reliability is written to the LLR memory at 1014. After processing at 1008, 1012, or 1014, it is determined if the process is done. If not, it is determined at 1000 if a retry is waiting.

Figure 11:
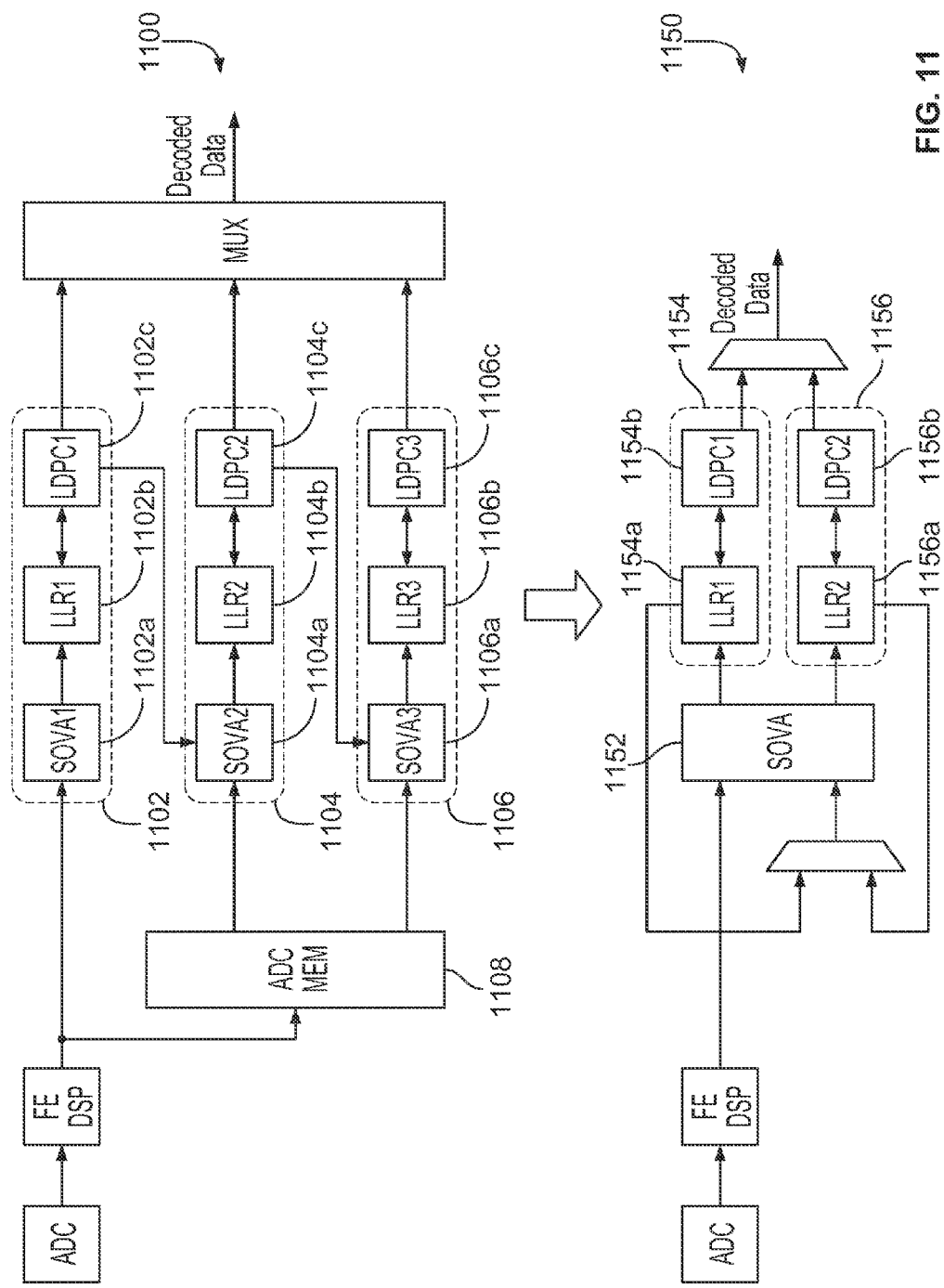
FIG. 11 is a diagram showing an embodiment of a decoding system with a shared soft output Viterbi algorithm (SOVA) with two LLR-LDPC processing paths.

FIG. 11 is a diagram showing an embodiment of a decoding system with a shared soft output Viterbi algorithm (SOVA) with two LLR-LDPC processing paths. In the example shown, decoder 1150 shows one embodiment of a shared SOVA system that can be used to replace decoder 1100. Decoder 1100 includes processing paths 1102, 1104, and 1106. Processing paths 1102 is used to decode data received from Front-end DSP by passing it through SOVA 1102*a*, LLR 1102*b*, and LDPC 1102*c*. If decoding fails after processing by processing path 1102, processing path 1104 (which includes SOVA 1104*a*, LLR 1104*b*, and LDPC 1104*c*) attempts to decode the data. If decoding by processing path 1104 fails, then processing path 1106 (which includes SOVA 1106*a*, LLR 1106*b*, and LDPC 1106*c*) attempts to decode the data. In this example, if decoder 1150 is unable to properly decode the data after three processing attempts (e.g., corresponding to processing paths 1102, 1104, and 1106), the decoder stops trying to decode that data.

Decoder 1150 includes a single SOVA (1152). SOVA 1152 is shared by processing paths 1154 (which includes LLR 1154*a* and LDPC 1154*b*) and 1156 (which includes LLR 1156*a* and LDPC 1156*b*). Processing path 1154 is configured to perform a first or initial processing of data received from SOVA 1152. If processing path 1154 is unable to properly decode the data, processing path 1156 attempts to decode the data. In various embodiments, processing path 1156 is configured to attempt multiple decodes of a given piece of data. For example, if processing path 1156 fails to decode data it may be configured to attempt decoding again. In some embodiments, processing path 1156 is configured to attempt decoding up to N times, where N is a configurable or programmable number.

In this particular example, decoder 1150 (with a single shared SOVA) is used in place of a decoder with 3 SOVAs/processing paths). In some other embodiments, a system with a shared SOVA (e.g., decoder 1150) may be used in place of a system with any number of SOVAs and/or processing paths.

Decoder 1100 and 1150 perform the same function but some lower level characteristics may not necessarily be the same between the two. In some cases for example, the order in which decoded data is output may vary between decoder 1100 and 1150. For example, decoder 1100 may output data in order whereas decoder 1150 may output data out of order. In another example, the latency or processing time associated with decoders 1100 and 1150 may not necessarily be the same. One decoder may have a longer processing time or delay from start to finish compared to the other.

Figure 12:
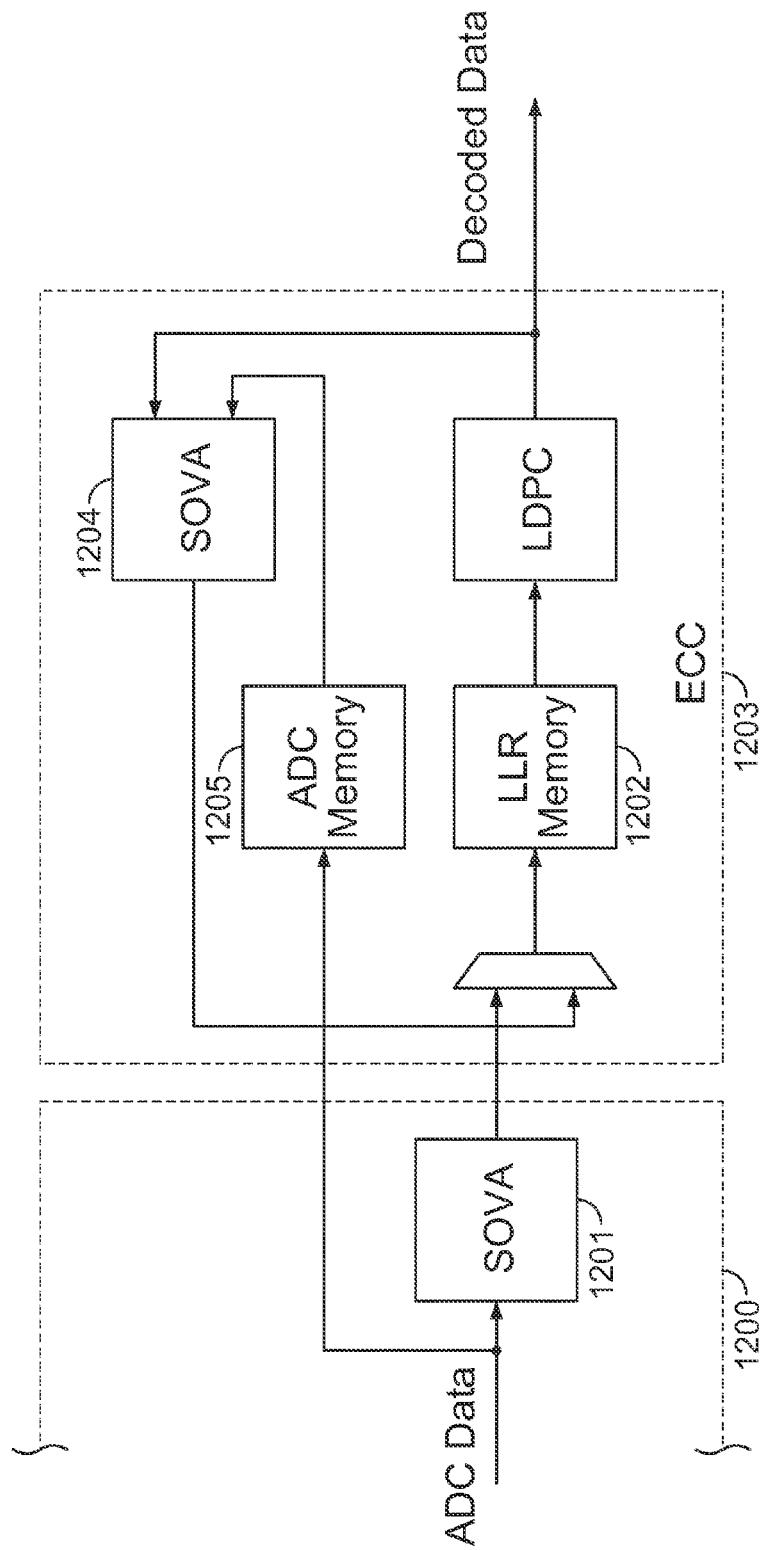
FIG. 12 is a diagram showing an example of some other system which does not use a shared SOVA.

FIG. 12 is a diagram showing an example of some other system which does not use a shared SOVA. In the example shown, SOVA 1201 in Front-end portion 1200 is not shared and another SOVA (i.e., SOVA 1204) is required in ECC 1203. LLR memory 1202 in ECC 1203 is required in this system because SOVA 1201 outputs data continuous and LLR memory 1202 is required to buffer this data, otherwise data will be lost since LDPC processing time can vary. ADC memory 1205 is required for SOVA 1204.

A typical ECC system is shown in FIG. 12, where ADC data is sent to a SOVA (or Viterbi decoder) directly. Reliability data is pre-computed and stored in an LLR memory which is to be used by LDPC decoder. Extrinsic LLR data of the LDPC decoder is sent to another SOVA within the ECC system for global iteration (turbo equalization).

The number of sectors buffered in memory is dependent upon the LDPC decoding latency. However, both the ADC and LLR data of each sector must be buffered in this scheme.

What is disclosed herein (in at least some embodiments) is to buffer an ADC memory before SOVA processing as shown in the next figure. Using this scheme, only ADC data is buffered during LDPC decoding. LLR is computed when needed. In some embodiments, LLR is buffered to compensate for the SOVA latency so that the LDPC decoder can be utilized more efficiently. What is also disclosed herein (in at least some embodiments) is to share the SOVA such that the shared SOVA can process data from both the channel and the LDPC decoder in a multiplexed manner. In contrast, the SOVAs in FIG. 12 can only process data from a single source (i.e., only the channel or only the LDPC decoder but not both). An example of the above techniques is show in the figure below.

Figure 13:
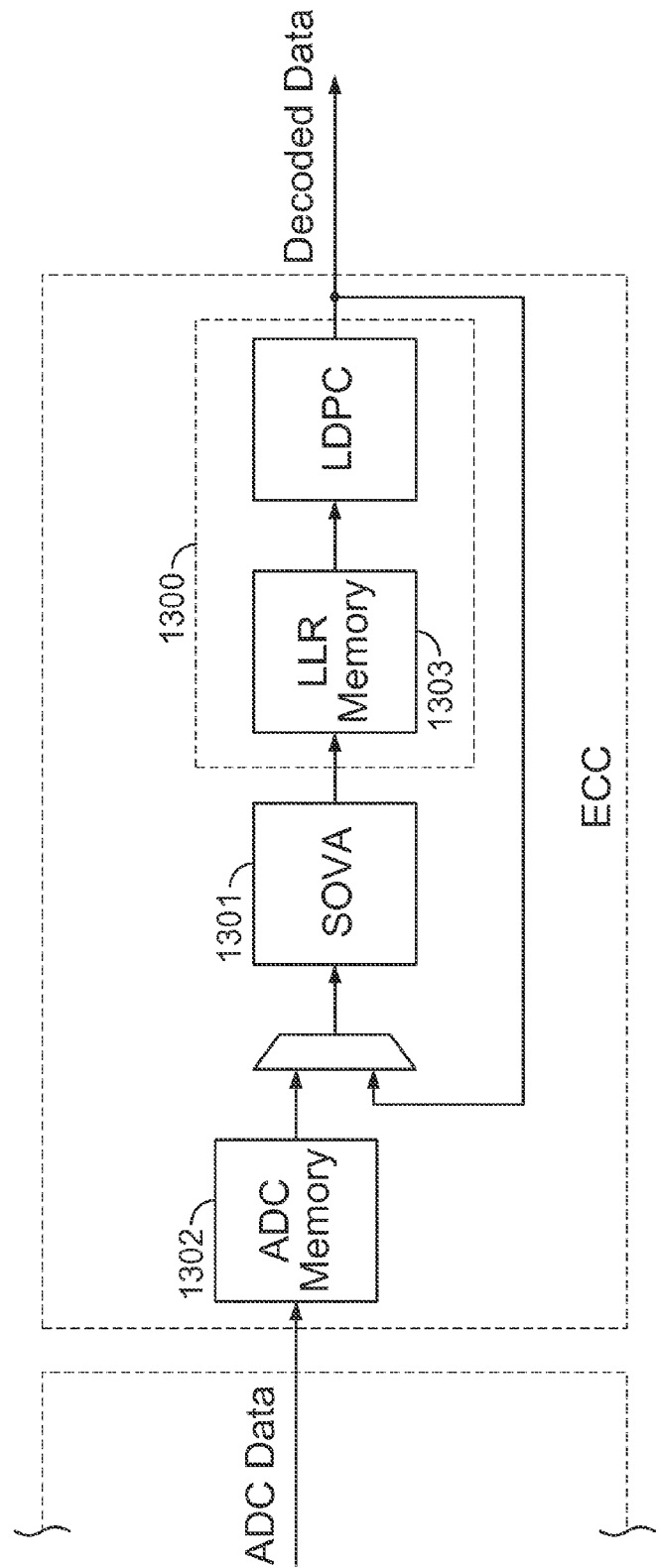
FIG. 13 is a diagram showing an embodiment of a system with a shared SOVA.

FIG. 13 is a diagram showing an embodiment of a system with a shared SOVA. In the example shown, the purpose or function performed by ADC memory 1302 is different than that of ADC memory 1205 in FIG. 12. Whereas ADC memory 1302 buffers ADC data for all iterations or repetitions of SOVA processing (including a first or initial pass), ADC memory 1205 is used for second and later iterations of SOVA processing (e.g., if decoding fails during a first or initial pass). LLR memory 1303 is not required and in some embodiments LLR memory 1303 is not included. SOVA 1301 only executes when need (e.g., when block 1300 is idle or is able to accept SOVA output). In some embodiments, although not required, LLR memory 1303 is included in block 1300 to improve speed. The size of 1303 is at least in some embodiments much smaller than LLR memory 1202 in FIG. 12.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for decoding information, comprising:
   a processor; and
   a memory coupled with the processor, wherein the memory is configured to provide the processor with instructions which when executed cause the processor to:
   decode analog to digital converted (ADC) data using a Viterbi decoder;
   decode an output of an iterative error correction decoder using the Viterbi decoder in the event error correction decoding by the iterative error correction decoder fails;
   decode Viterbi decoded data generated by the Viterbi decoder using the iterative error correction decoder; and
   send, from the iterative error correction decoder to a memory, a reservation request prior to completion of the decoding of the Viterbi decoded data by the iterative error correction decoder.

2. The system of claim 1, wherein the memory is further configured to provide the processor with instructions which when executed cause the processor to store, in a second memory, the ADC data and to pass the ADC data from the second memory to the Viterbi decoder.

3. The system of claim 1, wherein the iterative error correction decoder includes a low-density parity-check (LDPC) decoder.

4. The system of claim 1, wherein the Viterbi decoder includes a soft output Viterbi decoder.

5. The system of claim 1, wherein:
   in the event error correction decoding fails and a number of failures for that sector exceeds a maximum number of failures, the iterative error correction decoder is configured to declare a failure; and
   in the event error correction decoding fails and the number of failures for that sector does not exceed the maximum number of failures, the iterative error correction decoder is configured to retry the sector by passing the output of the iterative error correction decoder to the Viterbi decoder for decoding.

6. The system of claim 1, wherein the memory is further configured to provide the processor with instructions which when executed cause the processor to store data output by the Viterbi decoder in the event the iterative error correction decoder is occupied.

7. The system of claim 1, wherein the system is used in place of another system that includes two or more soft output Viterbi decoders.

8. The system of claim 1, wherein the system includes one or more of the following: an application-specific integrated circuit (ASIC) or a field-programmable gate array (FPGA).

9. The system of claim 1, wherein the memory is further configured to provide the processor with instructions which when executed cause the processor to send, from the iterative error correction decoder to the memory, a reservation cancellation in the event error correction decoding of the Viterbi decoded data by the iterative error correction decoder succeeds.

10. The system of claim 9, wherein the memory is further configured to provide the processor with instructions which when executed cause the processor to send, from the iterative error correction decoder to the memory, extrinsic information associated with the reservation request in the event error correction decoding of the Viterbi decoded data by the iterative error correction decoder fails.

11. A method for decoding information, comprising:
    decoding analog to digital converted (ADC) data using a Viterbi decoder;
    decoding an output of an iterative error correction decoder using the Viterbi decoder in the event error correction decoding by the iterative error correction decoder fails;
    decoding Viterbi decoded data generated by the Viterbi decoder using the iterative error correction decoder; and
    sending, from the iterative error correction decoder to a memory, a reservation request prior to completion of the decoding of the Viterbi decoded data by the iterative error correction decoder.

12. The method of claim 11 further comprising storing, in a second memory, the ADC data and passing the ADC data from the second memory to the Viterbi decoder.

13. The method of claim 11, wherein the iterative error correction decoder includes a low-density parity-check (LDPC) decoder.

14. The method of claim 11, wherein the Viterbi decoder includes a soft output Viterbi decoder.

15. The method of claim 11, wherein:
    in the event error correction decoding fails and a number of failures for that sector exceeds a maximum number of failures, the iterative error correction decoder is configured to declare a failure; and
    in the event error correction decoding fails and the number of failures for that sector does not exceed the maximum number of failures, the iterative error correction decoder is configured to retry the sector by passing the output of the iterative error correction decoder to the Viterbi decoder for decoding.

16. The method of claim 11 further comprising storing data output by the Viterbi decoder in the event the iterative error correction decoder is occupied.

17. The method of claim 11, wherein the method is performed using one or more of the following: an application-specific integrated circuit (ASIC) or a field-programmable gate array (FPGA).

18. The method of claim 11 further comprising sending, from the iterative error correction decoder to the memory, a reservation cancellation in the event error correction decoding of the Viterbi decoded data by the iterative error correction decoder succeeds.

19. The method of claim 18 further comprising sending, from the iterative error correction decoder to the memory, extrinsic information associated with the reservation request in the event error correction decoding of the Viterbi decoded data by the iterative error correction decoder fails.

20. A computer program product for decoding information, the computer program product being embodied in a tangible computer readable storage medium and comprising computer instructions for:

decoding analog to digital converted (ADC) data using a Viterbi decoder;

decoding an output of an iterative error correction decoder using the Viterbi decoder in the event error correction decoding by the iterative error correction decoder fails;

decoding Viterbi decoded data generated by the Viterbi decoder using the iterative error correction decoder; and sending, from the iterative error correction decoder to a memory, a reservation request prior to completion of the decoding of the Viterbi decoded data by the iterative error correction decoder.

21. The computer program product of claim 20 further comprising computer instructions for sending, from the iterative error correction decoder to the memory, a reservation cancellation in the event error correction decoding of the Viterbi decoded data by the iterative error correction decoder succeeds.

22. The computer program product of claim 21 further comprising computer instructions for sending, from the iterative error correction decoder to the memory, extrinsic information associated with the reservation request in the event error correction decoding of the Viterbi decoded data by the iterative error correction decoder fails.

* * * * *